(12) United States Patent
Lotfi et al.

(10) Patent No.: US 6,351,033 B1
(45) Date of Patent: Feb. 26, 2002

(54) MULTIFUNCTION LEAD FRAME AND INTEGRATED CIRCUIT PACKAGE INCORPORATING THE SAME

(75) Inventors: Ashraf W. Lotfi, Bridgewater; John D. Weld, Ledgewood, both of NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/413,605

(22) Filed: Oct. 6, 1999

(51) Int. Cl.[7] .......................... H05K 5/02; H01L 23/48; H01L 27/02; H01L 29/00; H01F 7/06
(52) U.S. Cl. .................. 257/724; 257/666; 257/692; 257/728; 257/532; 257/528; 257/531; 257/694; 257/698; 257/691; 257/924; 363/17; 363/6 L; 363/98; 363/141; 336/232; 336/200
(58) Field of Search ................. 257/466, 692, 257/532, 724, 528, 728, 531, 784, 298, 669, 723, 698, 696, 693, 691, 924; 336/232, 200, 183, 255, 328; 363/17, 91, 98, 141

(56) References Cited

U.S. PATENT DOCUMENTS

| | | | | |
|---|---|---|---|---|
| 4,297,647 A | * | 10/1981 | Akiyama et al. ............ 330/307 |
| 4,308,591 A | * | 12/1981 | George et al. ................. 365/2 |
| 4,860,433 A | * | 8/1989 | Miura .......................... 29/840 |
| 4,873,757 A | * | 10/1989 | Nillians ....................... 29/852 |
| 5,103,283 A | * | 4/1992 | Hite |
| 5,396,101 A | * | 3/1995 | Shiga .......................... 257/531 |
| 5,428,885 A | * | 7/1995 | Takaya et al. ................. 29/620 |
| 5,532,656 A | * | 7/1996 | Yoshimura ................... 333/185 |
| 5,539,241 A | * | 7/1996 | Abidi et al. ................. 257/516 |
| 5,608,359 A | * | 3/1997 | Knecht et al. ............... 257/666 |
| 5,621,635 A | * | 4/1997 | Takiar ......................... 363/141 |
| 5,742,490 A | * | 4/1998 | Bhagwat et al. .............. 363/17 |
| 5,781,093 A | * | 7/1998 | Grandmont et al. ........ 336/232 |
| 5,787,569 A | | 8/1998 | Lotfi et al. ................. 29/602.1 |
| 5,793,272 A | * | 8/1998 | Burghortz et al. .......... 336/200 |
| 5,804,880 A | * | 9/1998 | Mathew ....................... 257/777 |
| 5,804,952 A | | 9/1998 | Chen ........................... 323/255 |
| 5,814,884 A | * | 9/1998 | Davis et al. ................. 257/723 |
| 5,818,102 A | * | 10/1998 | Rostoker ...................... 257/666 |
| 5,839,184 A | * | 11/1998 | Ho et al. ....................... 29/605 |
| 5,844,301 A | * | 12/1998 | Van Roosmalen .......... 257/532 |
| 5,909,050 A | * | 6/1999 | Furey et al. ................. 257/531 |
| 5,913,551 A | * | 6/1999 | Tsatsumi et al. .............. 29/605 |
| 5,926,373 A | * | 7/1999 | Stevens ....................... 257/796 |
| 5,939,955 A | * | 8/1999 | Chen et al. .................. 333/185 |
| 5,949,326 A | * | 9/1999 | Grandmont et al. ........ 336/237 |
| 5,959,842 A | | 9/1999 | Leonard et al. ............. 361/752 |
| 5,986,912 A | * | 11/1999 | Hsiad et al. ................. 363/147 |
| 6,018,468 A | * | 1/2000 | Archer et al. ................. 363/17 |
| 6,157,284 A | * | 2/2000 | Kanazawa ................... 336/198 |
| 6,121,770 A | * | 9/2000 | Sudo .......................... 324/244 |

FOREIGN PATENT DOCUMENTS

| | | | |
|---|---|---|---|
| DE | 44 10 212 A1 | 9/1995 | ........... H01L/25/04 |
| EP | 61152052 | 10/1986 | ........... H01L/23/48 |
| EP | 0 600 488 A3 | 6/1994 | ........... H01L/23/64 |
| EP | 0 600 488 A2 | 6/1994 | ........... H01L/23/64 |

OTHER PUBLICATIONS

"Lead–Frame–Based Design Yields an IC–Like Module With No Substrate"; Electronic Design; May 28, 1996 (2 pages).

U.S. Patent Application Serial No. 09/266,531, by Roessler, et al., entitled "Edge–Mountable Integrated Circuit Package and Method of Attaching the Same to a Printed Wiring Board" filed on Mar. 11, 1999.

U.S. Patent Application Serial No. 08/678,917 by Roessler, et al., entitled "Package for an Electronic Device and Method of Manufacture Therefor" filed on Jan. 28, 1999.

* cited by examiner

*Primary Examiner*—Alexander O. Williams

(57) ABSTRACT

The present invention provides a lead frame for use in packaging a circuit having a discrete component, and a method of manufacture thereof. In one embodiment, the lead frame includes a lead support structure and a plurality of severable leads that are coupled to the lead support structure. The plurality of severable leads extend inward from the lead support structure to predetermined locations corresponding to terminals of the discrete component.

12 Claims, 4 Drawing Sheets

MULTIFUNCTION LEAD FRAME AND INTEGRATED CIRCUIT PACKAGE INCORPORATING THE SAME

CROSS REFERENCE TO RELATED APPLICATIONS

The present application is related to the following applications.

| Reference No. | Title | Inventors | Date |
|---|---|---|---|
| U.S.Pat. No. 5,787,569 | ENCAPSULATED PACKAGE FOR POWER MAGNETIC DEVICES AND METHOD OF MANUFACTURE THEREFOR | Lotfi, et al. | Issued 8/4/98 |
| U.S. Pat. No. 5,804,952 | ENCAPSULATED PACKAGE FOR A POWER MAGNETIC DEVICE AND METHOD OF MANUFACTURE THEREFOR | Chen | Issued 9/8/98 |
| U.S. Ser. No. 08/678,917 | PACKAGE FOR AN ELECTRONIC DEVICE AND METHOD OF MANUFACTURE THEREFOR | Roessler, et al. | Filed 1/28/99 |
| U.S. Ser. No. 9/078/791 | SURFACE MOUNT POWER SUPPLY PACKAGE AND METHOD OF MANUFACTURE THEREOF | Leonard, et al. | Filed 5/14/98 |
| U.S. Ser. No. 09/266,531 | EDGE-MOUNTABLE INTEGRATED CIRCUIT PACKAGE AND METHOD OF ATTACHING THE SAME TO A PRINTED WIRING BOARD | Roessler, et al. | Filed 3/11/99 |

The aforementioned applications and patents are commonly assigned with the present invention and are incorporated herein by reference.

TECHNICAL FIELD OF THE INVENTION

The present invention is directed, in general, to packaging for electronic components and, more specifically, to a multifunction lead frame and an IC package incorporating the lead frame for both lead and internal component purposes.

BACKGROUND OF THE INVENTION

Power supplies and especially power converters are becoming increasingly important elements of systems in the telecommunications and computer-related fields. In conjunction therewith, the power converters require increased power densities, which relate a power output capability to the size of the power unit. Typically, power converters include a combination of integrated circuits (ICs) and discrete components.

The packaging of the power units continues to be a challenging area due to the desired power densities in view of, for instance, the thermal limitations associated with packaging more power in a smaller package. Previous efforts to create monolithic-like power processing modules have been relegated to packaging discrete components into a single integrated package. The resulting packages suffer from a number of shortcomings as hereinafter described.

Since discrete components are generally prepackaged in a variety of preselected component sizes, sizable printed wiring boards (PWBs) or substrates are necessary to accommodate the components and to make the interconnections therebetween. This detracts from the power density of the power unit due, in pertinent part, to a loss of space efficiency. Additionally, there is usually an increased incremental cost associated with using prepackaged discrete components, since many of the current packaging strategies are based on ICs. Therefore, the use of prepackaged discrete components represents the use of "piece parts" in a primarily IC environment.

As a result, current packaging schemes are directed to packaging styles, weights, sizes and configurations that are standardized around IC units. To accommodate such designs, however, irregularly shaped components are often necessary thereby adding to the cost and complexity of designing and producing packaged units.

Additionally, a circuit performance problem may arise when using prepackaged discrete components. Since the spacing between prepackaged discrete components is typically larger than the spacing between ICs, parasitic inductance and capacitance becomes a factor in the response capability of the higher frequency circuits. This may adversely impact the design of the power unit as additional components may be necessary to compensate for the parasitic elements mentioned above.

Accordingly, what is needed in the art is a more effective system and method of packaging discrete components or ICs applicable in any environment.

SUMMARY OF THE INVENTION

To address the above-discussed deficiencies of the prior art, the present invention provides a lead frame for use in packaging a circuit having a discrete component, and a method of manufacture thereof. In one embodiment of the present invention and with reference to FIGS. 1A and 1B, the lead frame 100 includes (1) a lead support structure 105, and (2) a plurality of severable leads 110 coupled to the lead support structure 105 that extend inward therefrom to predetermined locations corresponding to terminals of the discrete component.

The present invention introduces, in one aspect, the broad concept of employing a lead frame to package a discrete component, which may be used in cooperation with another discrete component attached to the lead frame. Alternately, the discrete component may be coupled to an IC attached to the lead frame. The discrete component can be selected from the group consisting of, for instance, a power switch, a capacitor, an inductor and a transformer. Of course, other discrete components are acceptable as dictated by design requirements. This approach allows pertinent components to be attached to the lead frame thereby increasing the utility of the lead frame and lowering the overall cost associated with packaging the components. This approach also extends and enhances overall modularity, which provides a generally improved flexibility of design. In summary, extending the use of the lead frame to include the coupling, for instance, of discrete components, ICs, and magnetic elements in the forming of circuits, extends and enhances the ability to increase power densities, systemize packaging strategies and lower costs.

In one embodiment of the present invention, the circuit includes an IC and the lead frame includes a second plurality of severable leads coupled to the lead support structure. The second plurality of severable leads extends inward to predetermined locations corresponding to terminals of the IC. Additionally, the lead frame may include material that is bendable. This structure facilitates direct connection of discrete components to the IC. Also, the lead support structure may form a periphery of the lead frame, although alternative designs are well within the broad scope of the invention.

In one embodiment of the present invention, the discrete component is a magnetic device having a magnetic core and the lead frame includes a severable lead having a circinate portion that forms a winding of the magnetic device. A circinate winding structure consists of a flat coil of conductor. In one embodiment, each loop of the conductor forms one turn of the winding for the magnetic device. In an embodiment to be illustrated and described, the winding consists of four circinate loops that are rectilinear. Of course, a plurality of circinate windings may interact with a magnetic core to form a magnetic device such as a transformer. The present invention is not limited to a circinate winding structure and other lead frame winding structures are well within the broad scope of the present invention.

In one embodiment of the present invention, the circuit is a power converter. The power converter includes an IC containing a converter controller and discrete power processing components coupled to the IC. Additionally, a plurality of leads are coupled to corresponding terminals of the IC and the discrete power processing components. This embodiment preferably includes a body that encloses the IC, the discrete power processing components and a central portion of each of the plurality of leads. A peripheral portion of each of the plurality of leads extends outward from the body. Additionally, while the body may be composed of a dielectric material, other materials are equally applicable as needed.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1A:
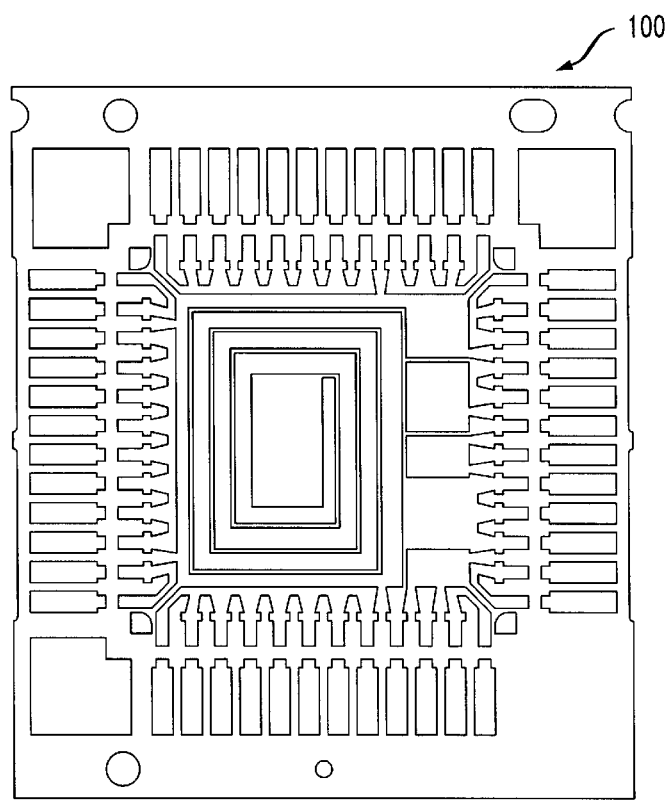
FIGS. 1A and 1B illustrate plan views of an embodiment of a lead frame constructed according to the principles of the present invention.
Figure 1B:
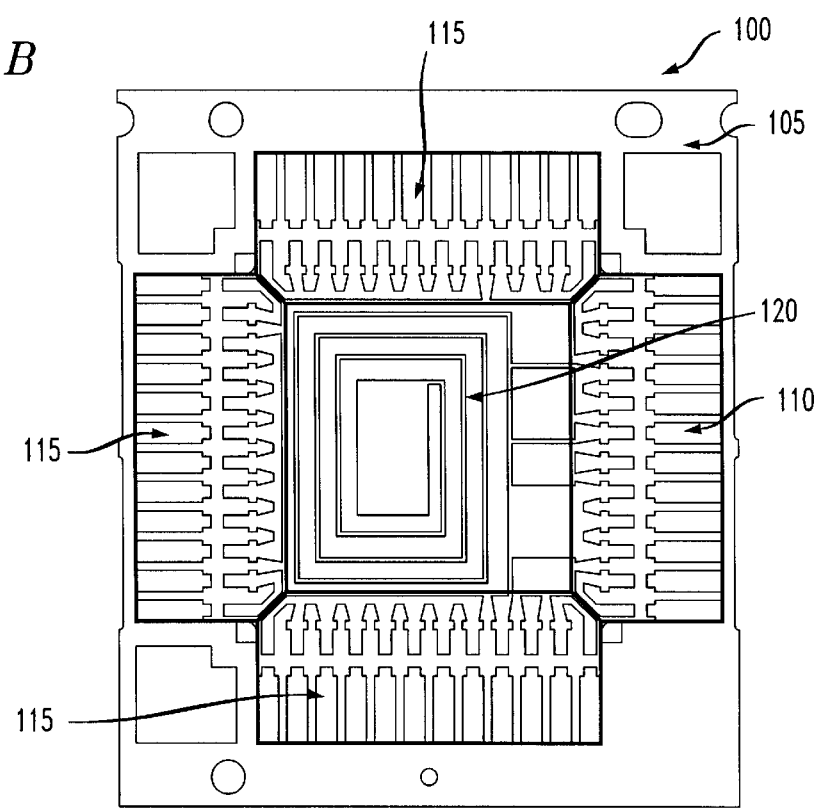

Referring initially to FIGS. 1A and 1B, illustrated are plan views of an embodiment of a lead frame 100 constructed according to the principles of the present invention. The lead frame 100 includes a lead support structure 105, a first plurality of severable leads 110 coupled to the lead support structure 105, a second plurality of severable leads 115 coupled to the lead support structure 105 and a circinate winding structure 120 consisting of a flat coil of conductor. While the lead support structure 105 forms a periphery of the lead frame 100, other designs are well within the broad scope of the invention. Also, it should be understood that the term "severable" in conjunction with the first and second plurality of severable leads 110, 120 generally includes leads that are electrically separated or isolated from one another.

The lead frame 100 is employed to package a circuit typically having at least one discrete component. The first plurality of severable leads 110 are seen to extend inward from the lead support structure 105 to predetermined locations corresponding to terminals that may be used to mount discrete components. The second plurality of severable leads 115 also extend inward to predetermined locations corresponding to terminals of an IC. The circinate winding structure 120 contains four circinate loops that are rectilinear, wherein each loop of the conductor forms one turn of a winding of a magnetic device such as an inductor. Additionally, the middle of the circinate winding structure 120 is open to accept a magnetic core of the magnetic device. In the illustrated embodiment, the lead frame 100 is made from a bendable metal that is electrically conductive (e.g., copper or Alloy 42) and may be formed using chemical etching or stamping. Of course, the broad scope of the present invention is not limited to circinate winding structures or any specific lead frame structure or construction technique.

Figure 2:
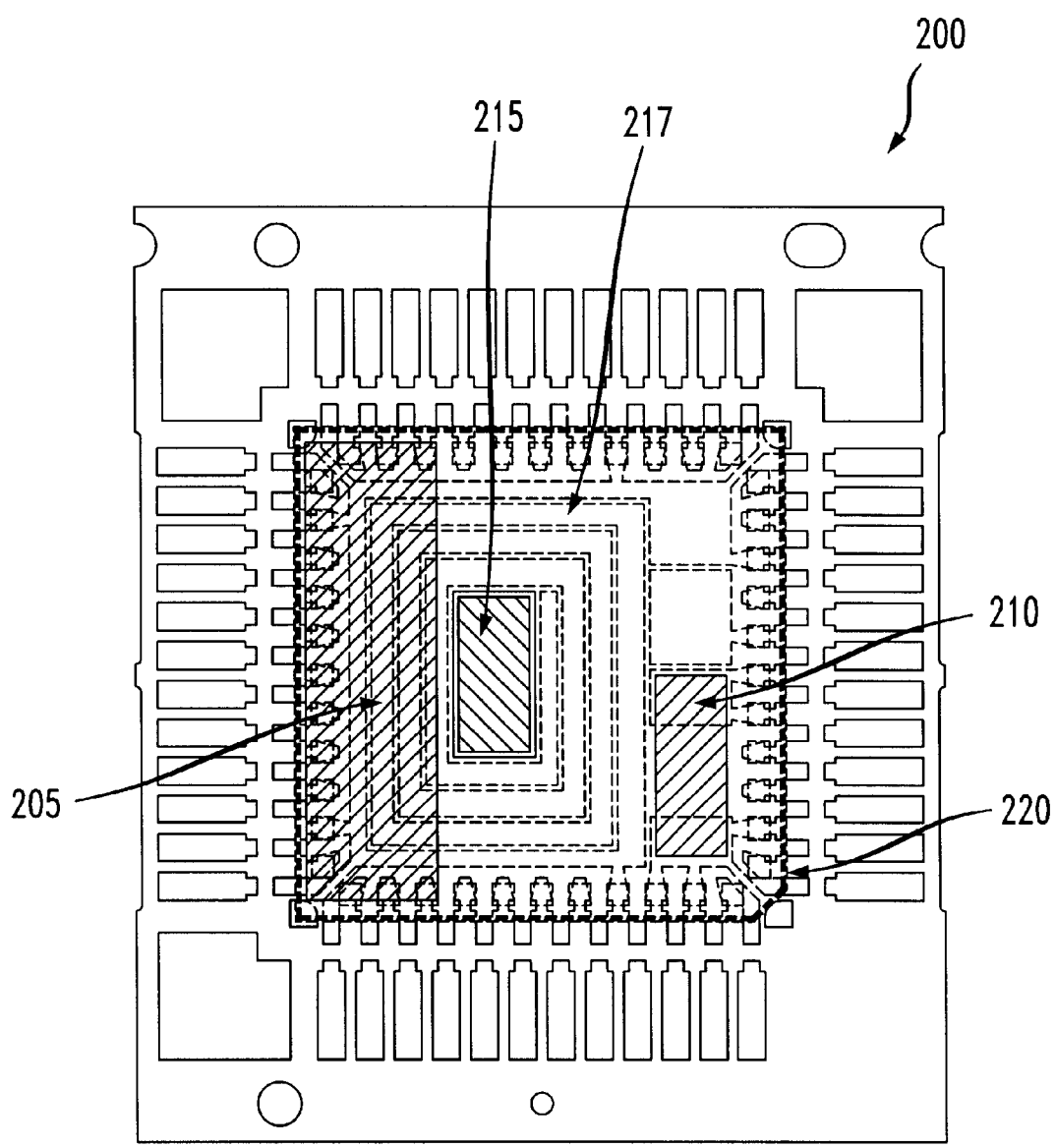
FIG. 2 illustrates a plan view of an embodiment of a lead frame constructed according to the principles of the present invention with components mounted thereto.

Turning now to FIG. 2, illustrated is a plan view of an embodiment of a lead frame 200 constructed according to the principles of the present invention with components mounted thereto. The components mounted to the lead frame 200 include an IC 205 having two switching devices, a discrete capacitor 210, a ferrite magnetic core 215, which forms a magnetic device with a winding structure 217 and a body 220 that is composed of a dielectric material and is used to cover the components. Thus, the lead frame 200 may be used to electrically connect a plurality of components into one or more circuits.

The lead frame 200, therefore, provides a mechanism to package several components to form a circuit having components that are, for instance, discrete, integrated or magnetic in nature. While the present embodiment illustrates a discrete capacitor 210, other discrete components are also acceptable as may be dictated by design requirements. This approach allows pertinent components to be attached to and incorporated within an otherwise standard lead frame thereby increasing the utility of the lead frame and lowering the overall cost associated with packaging the components. This approach also extends and enhances overall modularity, which generally improves the flexibility of design. Standard profiles such as dual in-line packages (DIPs), quad flat packs (QFPs) or plastic lead carrier chips (PLCCs), as well as custom profiles may be adopted or adapted for use.

In this embodiment, the circuit is a power converter. The power converter includes the IC 205 which contains a converter controller and two power switches. The power converter further includes discrete power processing components in the form of the discrete capacitor 210 and the magnetic device, which are coupled to the IC 205.

Additionally, a plurality of leads (see FIG. 3) are coupled to corresponding terminals of the IC 205 and the discrete power processing components (e.g., the discrete capacitor 210). The body 220 encloses the IC 205, the discrete power processing components and a central portion of each of the plurality of leads, as shown. A peripheral portion of each of the plurality of leads extends outwardly from the body 220.

Figure 3:
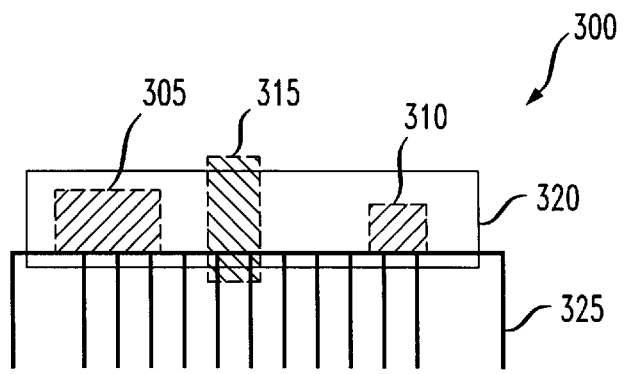
FIG. 3 illustrates a side view of a package including a lead frame constructed according to the principles of the present invention.

Turning now to FIG. 3, illustrated is a side view of a package 300 including a lead frame 325 constructed according to the principles of the present invention. The package 300 includes an IC 305, a discrete capacitor 310, a ferrite magnetic core 315 and a body 320 analogous to the circuit of FIG. 2. Additionally, the package 300 shows a plurality of leads 325 that have been severed by removal of the lead support structure (see FIG. 1) and further separation of appropriate leads as required. Then, the plurality of leads are bent to allow proper insertion of the package 300 as an assembly.

Figure 4:
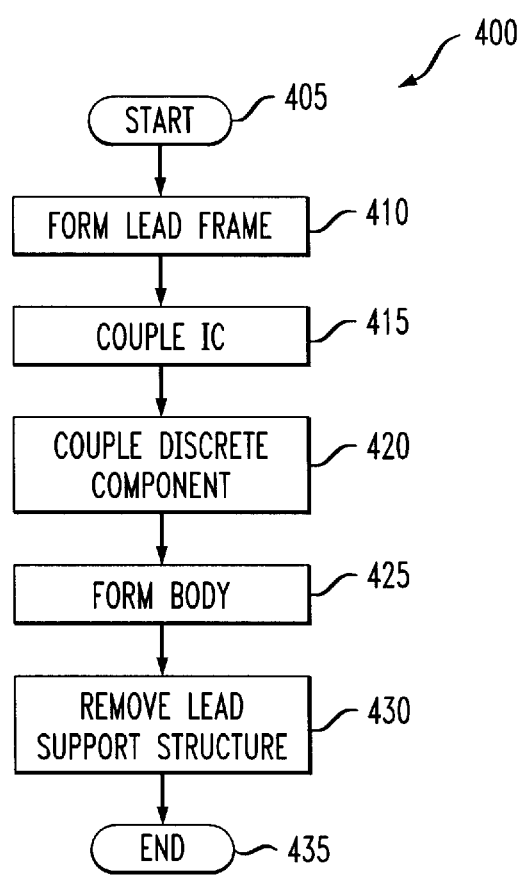
FIG. 4 illustrates a flow diagram of a method of manufacturing a power converter employing a lead frame constructed according to the principles of the present invention.

Turning now to FIG. 4, illustrated is a flow diagram of a method (generally designated 400) of manufacturing a power converter employing a lead frame constructed according to the principles of the present invention. The method 400 starts in a start step 405 with the decision to manufacture the power converter. A lead frame is formed, as illustrated in the embodiment of FIG. 1, in a step 410 that includes a lead support structure and a plurality of severable leads coupled to the lead support structure that extend inward therefrom to predetermined locations corresponding to terminals of an IC and any discrete power processing components.

Then, in a step 415, the IC is coupled to appropriate ones of the plurality of severable leads and, in a step 420, the discrete power processing components are coupled to others of the plurality of severable leads. In a step 425, a body is formed about the IC, the discrete power processing components and a central portion of each of the plurality of leads with a peripheral portion of each of the plurality of leads extending outwardly from the body. The center portion of the body is open to accommodate, for instance, a ferrite magnetic core, which penetrates a circinate portion that forms a winding (the core and winding thereby forming a magnetic device). Then, the lead support structure is removed in a step 430. The method 400 ends in an end step 435.

Figure 5:
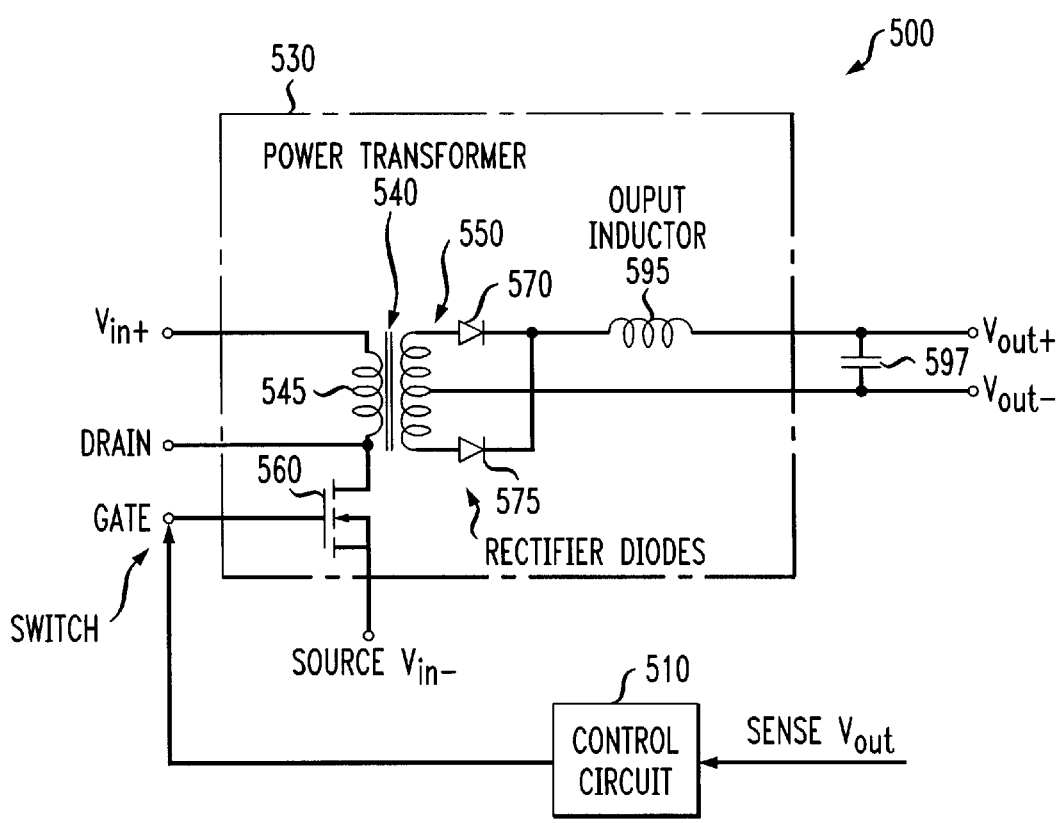
FIG. 5 illustrates a schematic diagram of a power converter constructed according to the principles of the present invention.

Turning now to FIG. 5, illustrated is a schematic diagram of a power converter 500 constructed according to the principles of the present invention. The power converter 500 employs a power train 530 coupled to control circuitry 510 for applying control signals to the power train 530. The power train 530 has a power train input coupled to a source of electrical power for receiving an input voltage Vin and a power train DC output coupled to an electrical load. The power converter 500 further contains a filter capacitor 597 for filtering the power train DC output voltage Vout.

The power train 530 includes an isolation transformer 540 having a primary winding 545 and secondary winding 550. The power train 530 further includes a switch 560 coupled to the primary winding 545 of the isolation transformer 540. In the illustrated embodiment, the switch 560 is a FET. Of course, other switches (e.g., bipolar transistors) may also be used. The power train 530 further includes a rectifier (consisting of a pair of rectifying diodes 570, 575) coupled to the secondary winding 550 of the isolation transformer 540. Alternatively, other rectifying devices and circuits (e.g., active switches, such as FETs, in a synchronous rectifier) may be employed to advantage. The rectifying diodes 570, 575 rectify a periodic waveform supplied thereto by the secondary winding 550. The power train 530 still further includes an output inductor 595, coupled to the rectifier. The power train 530 employs the isolation transformer 540, rectifying diodes 570, 575, and output inductor 595 to convert AC electrical power into DC electrical power.

The components may be individually coupled to the lead frame or integrated prior to being coupled to the lead frame to form a circuit package (in this case, a power converter package). Additionally, an encapsulant (not shown) may substantially surround the power train, individually, or in combination with the other components to form a power converter module.

Those skilled in the art should understand that the previously described embodiments of the lead frame and related method for use in packaging a circuit having a discrete component are submitted for illustrative purposes only and other embodiments are well within the broad scope of the present invention. Additionally, exemplary embodiments of the present invention have been illustrated with reference to specific electronic components. Those skilled in the art are aware, however, that components may be substituted (not necessarily with components of the same type) to create desired conditions or accomplish desired results. For instance, multiple components may be substituted for a single component and vice-versa. The principles of the present invention may be applied to a wide variety of power circuit topologies. For a better understanding of a variety of power converter topologies employing discrete and integrated magnetic techniques, see *Modern DC-to-DC Switchmode Power Converter Circuits*, by Rudolph P. Severns and Gordon Bloom, Van Nostrand Reinhold Company, New York, N.Y. (1985) and *Principles of Solid-State Power Conversion*, by Ralph E. Tarter, Howard W. Sam & Co., Inc., Indianapolis, Ind. (1985), which are incorporated herein by reference in their entirety.

Although the present invention has been described in detail, those skilled in the art should understand that they can make various changes, substitutions and alterations herein without departing from the spirit and scope of the invention in its broadest form.

What is claimed is:

1. For use in packaging a circuit, a lead frame, comprising:
    a lead support structure having a discrete component coupled thereto; and
    a plurality of severable leads coupled to said lead support structure and extending inward therefrom to predetermined locations corresponding to terminals of said discrete component, one of said plurality of severable leads forming a winding of a magnetic device.

2. The lead frame as recited in claim 1 wherein said circuit further has an element selected from the group consisting of:
    a second discrete component, and
    an integrated circuit (IC).

3. The lead frame as recited in claim 1 wherein said circuit further has an integrated circuit (IC) and said lead frame further comprises a second plurality of severable leads coupled to said lead support structure and extending inward therefrom to predetermined locations corresponding to terminals of said IC.

4. The lead frame as recited in claim 1 wherein said discrete component is a magnetic device having a magnetic core, a circinate portion of said one of said plurality of severable leads forming said winding of said magnetic device.

5. The lead frame as recited in claim 1 wherein said lead support structure forms a periphery of said lead frame.

6. The lead frame as recited in claim 1 wherein said discrete component is selected from the group consisting of:
   a power switch,
   a capacitor, and
   an inductor.

7. The lead frame as recited in claim 1 wherein said circuit is a power converter.

8. A power converter, comprising:
   an integrated circuit (IC) containing a converter controller;
   a lead frame having discrete power processing components coupled to said IC;
   a plurality of leads coupled to corresponding terminals of said IC and said discrete power processing component, one of said plurality of leads forming a winding of a magnetic device; and
   a body, enclosing said IC, said discrete power processing component and a central portion of each of said plurality of leads, a peripheral portion of said each of said plurality of leads extending outwardly from said body.

9. The power converter as recited in claim 8 wherein one of said discrete power processing components is a magnetic device having a magnetic core, a circinate portion of said one of said plurality of severable leads forming said winding of said magnetic device.

10. The power converter as recited in claim 9 wherein said circinate portion is rectilinear.

11. The power converter as recited in claim 8 wherein said discrete power processing components are selected from the group consisting of:
   a power switch,
   a capacitor, and
   an inductor.

12. The power converter as recited in claim 8 wherein said body is composed of a dielectric material.

* * * * *